(12) United States Patent
Cheng et al.

(10) Patent No.: US 12,512,374 B2
(45) Date of Patent: Dec. 30, 2025

(54) SEMICONDUCTOR STRUCTURE WITH VOID AND MANUFACTURING METHOD THEREOF

(71) Applicant: CHANGXIN MEMORY TECHNOLOGIES, INC., Hefei (CN)

(72) Inventors: Ming Cheng, Hefei (CN); Xing Jin, Hefei (CN); Ran Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 945 days.

(21) Appl. No.: 17/446,957

(22) Filed: Sep. 3, 2021

(65) Prior Publication Data

US 2022/0093478 A1  Mar. 24, 2022

Related U.S. Application Data

(63) Continuation of application No. PCT/CN2021/100314, filed on Jun. 16, 2021.

Foreign Application Priority Data

Sep. 18, 2020 (CN) .......................... 202010988656.4

(51) Int. Cl.
   *H01L 23/10* (2006.01)
   *G11C 5/06* (2006.01)
   *H10B 12/00* (2023.01)

(52) U.S. Cl.
   CPC ......... *H01L 23/10* (2013.01); *H10B 12/0335* (2023.02); *H10B 12/315* (2023.02); *H10B 12/482* (2023.02); *G11C 5/063* (2013.01)

(58) Field of Classification Search
   CPC ... H01L 23/10; H10B 12/482; H10B 12/0335; H10B 12/315; G11C 5/063
   See application file for complete search history.

(56) References Cited

U.S. PATENT DOCUMENTS

| 8,198,189 B2 | 6/2012 | Kim |
| 8,344,517 B2 | 1/2013 | Kim |

(Continued)

FOREIGN PATENT DOCUMENTS

| CN | 1855511 A | 11/2006 |
| CN | 102543944 A | 7/2012 |

(Continued)

OTHER PUBLICATIONS

Non-Final Office Action of the U.S. Appl. No. 17/389,752, issued on Feb. 22, 2024, 81 pages.

(Continued)

*Primary Examiner* — Matthew E Warren
(74) *Attorney, Agent, or Firm* — Syncoda LLC; Feng Ma

(57) ABSTRACT

A method for manufacturing a semiconductor structure includes: providing a substrate and a bit line structure located on the substrate, the bit line structure including a top dielectric layer and capacitive contact holes being provided on two opposite sides of the bit line structure; forming a first spacer covering a sidewall of the top dielectric layer between the bit line structure and the capacitive contact hole and a second spacer covering a sidewall of the first spacer, a top surface of the second spacer being higher than that of the first spacer; removing at least part of the top dielectric layer to form a first void; forming a first sealing film by a deposition process; and removing a part of the first sealing film which is higher than the top surface of the second spacer, the remaining first sealing film is a first sealing layer.

4 Claims, 17 Drawing Sheets

(56) References Cited

U.S. PATENT DOCUMENTS

| | | |
|---|---|---|
| 8,697,525 B2 | 4/2014 | Kim |
| 8,828,829 B2 | 9/2014 | Joung et al. |
| 8,921,223 B2 | 12/2014 | Lee |
| 8,941,157 B2 | 1/2015 | Kim et al. |
| 9,165,859 B2 | 10/2015 | Lim et al. |
| 9,275,937 B2 | 3/2016 | Lee |
| 9,331,072 B2 | 5/2016 | Seo |
| 9,337,202 B2 | 5/2016 | Lim et al. |
| 9,356,073 B1 * | 5/2016 | Kim .................. H01L 21/76897 |
| 9,379,004 B1 | 6/2016 | Kwon et al. |
| 9,419,000 B2 | 8/2016 | Kim |
| 9,576,895 B2 | 2/2017 | Lee |
| 9,786,598 B2 | 10/2017 | Kim et al. |
| 9,911,851 B2 | 3/2018 | Seo |
| 10,043,809 B1 * | 8/2018 | Chang .................. H10B 12/482 |
| 10,411,014 B2 | 9/2019 | Hwang et al. |
| 10,475,794 B1 | 11/2019 | Wu et al. |
| 2005/0012128 A1 * | 1/2005 | Bae ...................... H10B 12/315 257/296 |
| 2010/0285662 A1 | 11/2010 | Kim |
| 2012/0168899 A1 | 7/2012 | Kim |
| 2012/0217631 A1 | 8/2012 | Kim |
| 2013/0093093 A1 | 4/2013 | Lee |
| 2014/0159194 A1 * | 6/2014 | Song ...................... H10B 12/485 257/522 |
| 2014/0175659 A1 | 6/2014 | Lee |
| 2014/0179102 A1 | 6/2014 | Joung et al. |
| 2014/0217545 A1 | 8/2014 | Kim et al. |
| 2014/0299989 A1 | 10/2014 | Lim et al. |
| 2014/0367825 A1 | 12/2014 | Kim |
| 2015/0056801 A1 * | 2/2015 | Park .................... H01L 21/7682 438/655 |
| 2015/0076693 A1 | 3/2015 | Lee |
| 2015/0214220 A1 | 7/2015 | Seo |
| 2016/0005743 A1 | 1/2016 | Lim et al. |
| 2016/0027727 A1 | 1/2016 | Kim et al. |
| 2016/0133564 A1 | 5/2016 | Lee |
| 2016/0172304 A1 | 6/2016 | Lee et al. |
| 2016/0181143 A1 | 6/2016 | Kwon et al. |
| 2016/0204262 A1 | 7/2016 | Seo |
| 2016/0211215 A1 | 7/2016 | Lee |
| 2016/0225710 A1 | 8/2016 | Hwang |
| 2016/0329337 A1 | 11/2016 | Hwang et al. |
| 2017/0062347 A1 | 3/2017 | Kim |
| 2019/0088739 A1 * | 3/2019 | Lee ...................... H10B 12/488 |
| 2021/0217652 A1 | 7/2021 | Nam |
| 2022/0059543 A1 * | 2/2022 | Mun ...................... H10B 12/34 |
| 2022/0139924 A1 | 5/2022 | Liao |
| 2023/0056204 A1 | 2/2023 | Chen |

FOREIGN PATENT DOCUMENTS

| | | | | |
|---|---|---|---|---|
| CN | 103903994 A | | 7/2014 | |
| CN | 105280608 A | * | 1/2016 | ........... H01L 21/764 |
| CN | 105719998 A | | 6/2016 | |
| CN | 106941097 A | | 7/2017 | |
| CN | 110581103 A | | 12/2019 | |
| CN | 111584489 A | | 8/2020 | |
| KR | 20190037845 A | * | 4/2019 | ........... H10B 12/482 |

OTHER PUBLICATIONS

US office action in U.S. Appl. No. 17/451,456, mailed on Aug. 26, 2024.

* cited by examiner

SEMICONDUCTOR STRUCTURE WITH VOID AND MANUFACTURING METHOD THEREOF

CROSS-REFERENCE TO RELATED APPLICATIONS

The present application is a continuation of International Application No. PCT/CN2021/100314 filed on Jun. 16, 2021, which claims priority to China Patent Application No. 202010988656.4 filed on Sep. 18, 2020. The disclosures of these applications are hereby incorporated by reference in their entirety.

BACKGROUND

With the constant reduction of a feature size of a semiconductor integrated circuit, there is made a higher requirement to a manufacturing process of a Dynamic Random-Access Memory (DRAM).

SUMMARY

Embodiments of the present application relate generally to the field of semiconductors, and more specifically to a semiconductor structure and a manufacturing method thereof.

Embodiments of the present application provide a semiconductor structure and a manufacturing method thereof, which are favorable for improving the structural stability of a semiconductor structure.

In order to solve the foregoing problem, the embodiments of the present application provide a manufacturing method of a semiconductor structure, which includes: providing a substrate and a bit line structure located on the substrate, the bit line structure including a top dielectric layer, and capacitive contact holes being provided on two opposite sides of the bit line structure; forming a first spacer that covers a sidewall of the top dielectric layer, and forming a second spacer that covers a sidewall of the first spacer, the first spacer being located between the bit line structure and a capacitive contact hole, and a top surface of the second spacer being higher than a top surface of the first spacer; removing at least part of the top dielectric layer to form a first void; forming a first sealing film by a deposition process, the first sealing film covers the top surface of the first spacer and plugs a top opening of the void, a top surface of the first sealing film being higher than the top surface of the second spacer; and removing a part of the first sealing film which is higher than the top surface of the second spacer by a first planarization process, the remaining first sealing film is a first sealing layer.

Correspondingly, the embodiments of the present application also provide a semiconductor structure, which includes: a substrate, a bit line structure located on the substrate, and capacitive contact holes located on two opposite sides of the bit line structure; a first spacers, located between the bit line structure and a capacitive contact hole, a void existing between first spacers on the two opposite sides of the bit line structure; and a sealing layer, covering a top surface of the first spacer and plugging a top opening of the void, a thickness of the sealing layer on the first spacer being more than or equal to 30 nm in a direction perpendicular to the substrate.

BRIEF DESCRIPTION OF THE DRAWINGS

One or more embodiments are exemplarily illustrated through graphs in drawings corresponding thereto, but the exemplary illustration does not limit the embodiments; and element with same reference numerals in the drawings represent similar elements, and unless otherwise specifically specified, the graphs in the drawings do not represent the proportion limit.

DETAILED DESCRIPTION

In order to make the objectives, technical solutions, and advantages of the embodiments of the present application clearer, each embodiment of the present application will now be described in detail in combination with the drawings. However, those of ordinary skill in the art can understand that a lot of technical details are proposed to make the present application better understood by a reader in the embodiments of the present application. However, the technical solution claimed in the present application can also be implemented without these technical details and various changes and modifications based on the embodiments.

With the constant reduction of the feature size, a spacing between adjacent conductors is constantly reduced, and a dielectric layer that isolates the adjacent conductors is increasingly thin. In a case that a dielectric constant of the dielectric layer is kept unchanged, the dielectric layer is thinner, the problem of parasitic capacitance between the adjacent conductors is more serious.

FIGS. 1-17 illustrate structural schematic diagrams corresponding to each step in a manufacturing method for a semiconductor structure according to an embodiment of the present application.

Figure 1:
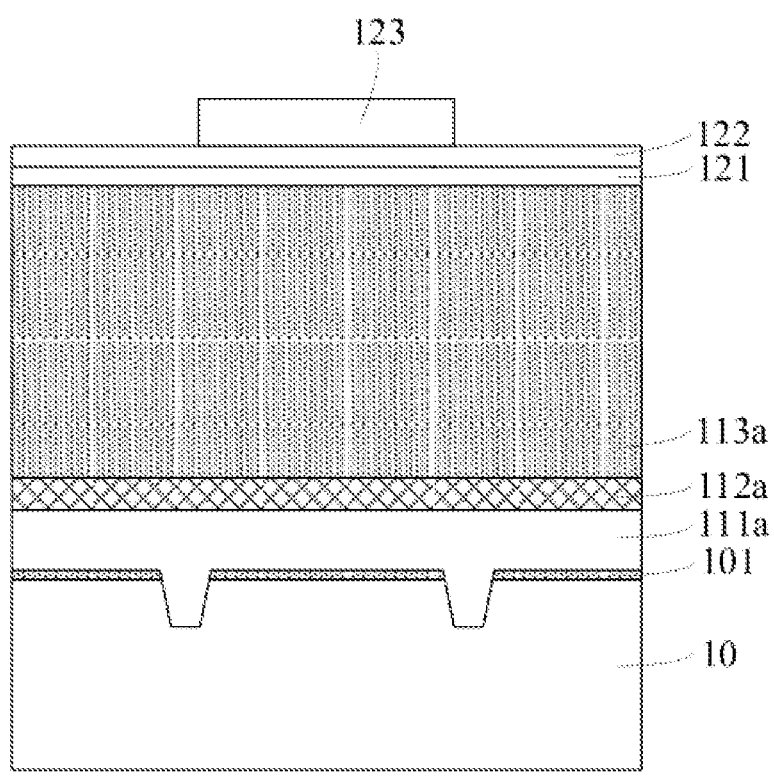
FIG. 1 illustrates a first structural schematic diagram corresponding to a step in a manufacturing method for a semiconductor structure according to an embodiment of the present application.

Referring to FIG. 1, a substrate 10 is provided. A bottom-layer dielectric film 101, a first conductive film 111a, a second conductive film 112a, a top-layer dielectric film 113a, a first mask layer 121, a second mask layer 122, and a third mask layer 123 are sequentially stacked on the substrate 10.

The bottom-layer dielectric film 101 is configured to isolate the first conductive film 111a from an active area (not shown in the figure) in the substrate 10. The material of the bottom-layer dielectric film 101 includes silicon nitride. A part of the conductive film 111a contacts with the active area, to form a bit line contact. The material of the first conductive film 111a includes polycrystalline silicon. The material of the second conductive film 112a includes tungsten. The top-layer dielectric film 113a acts as a dielectric layer and protects the second conductive film 112a. The material of the top-layer dielectric film 113a includes silicon nitride.

In the present embodiment, a mask layer includes the first mask layer 121 and the second mask layer 122. The first mask layer 121 is harder than the second mask layer 122, so that the etching accuracy of a subsequent etching process is improved. In other embodiments, there is also an anti-reflective coating between the first mask layer and the second mask layer, to reduce the problems of reflection, standing waves, etc.

The material of the first mask layer 121 may include silicon nitride. The material of the second mask layer 122 may include polycrystalline silicon. The anti-reflective coating is usually a carbon coating.

In the present embodiment, the third mask layer 123 is configured to limit the position of a subsequently formed bit line structure.

Figure 2:
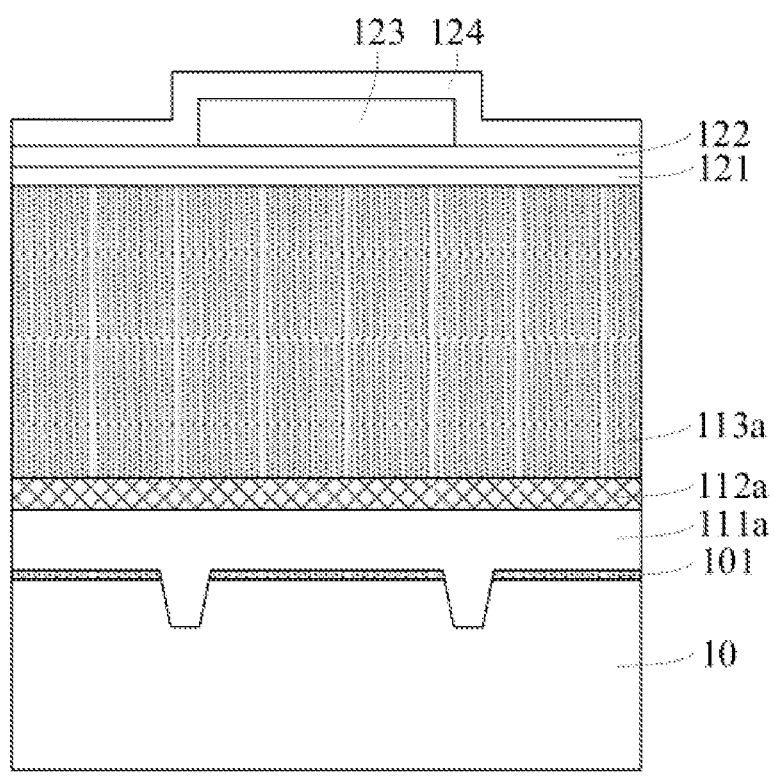
FIG. 2 illustrates a second structural schematic diagram corresponding to a step in a manufacturing method for a semiconductor structure according to an embodiment of the present application.

Referring to FIG. 2, a fourth mask layer 124 that covers a top surface and sidewall of the third mask layer 123 and a top surface of the second mask layer 122 is formed. The fourth mask layer 124 is configured to limit the width of the subsequently formed bit line structure in a direction parallel to the substrate 10.

Figure 3:
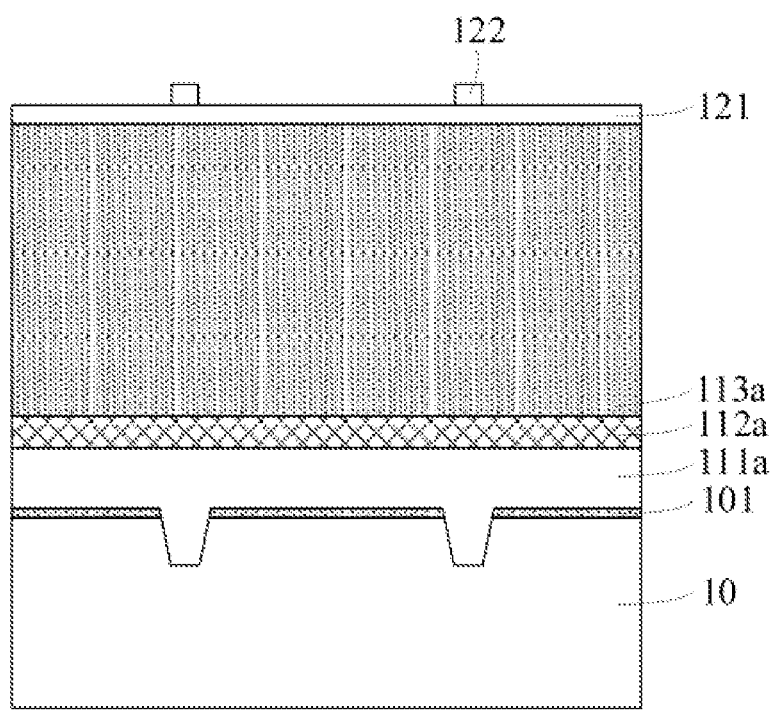
FIG. 3 illustrates a third structural schematic diagram corresponding to a step in a manufacturing method for a semiconductor structure according to an embodiment of the present application.

Referring to FIG. 3, the second mask layer 122 is etched by Self-aligned Double Patterning (SADP). The width of the remaining second mask layer 122 is equal to that of the fourth mask layer 124 (referring to FIG. 2) that covers the sidewall of the third mask layer 123 (referring to FIG. 2). The remaining second mask layer 122 is taken as a mask for forming the bit line structure by etching. The width of the remaining second mask layer 122 is equal to that of the subsequently formed bit line structure.

Figure 4:
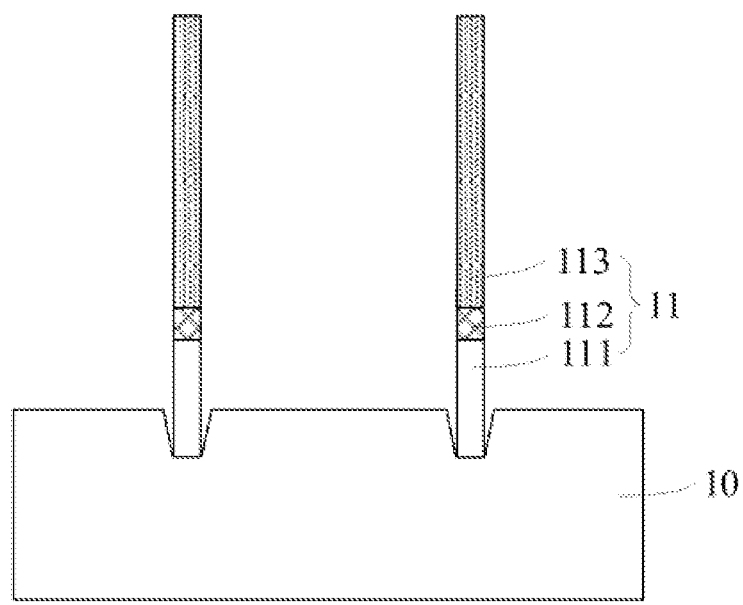
FIG. 4 illustrates a fourth structural schematic diagram corresponding to a step in a manufacturing method for a semiconductor structure according to an embodiment of the present application.

Referring to FIG. 4, the top-layer dielectric film 113a, the second conductive film 112a, the first conductive film 111a, and the bottom-layer dielectric film 101 (referring to FIG. 3) are etched through the remaining second mask layer 122 to form a bit line structure 11.

In the present embodiment, the bit line structure 11 includes a bottom dielectric layer (not shown in the figure), a conductive layer, and a top dielectric layer 113. The conductive layer includes a first conductive layer 111 and a second conductive layer 112. In other embodiments, the conductive layer may include one or more than two conductive layers.

Figure 5:
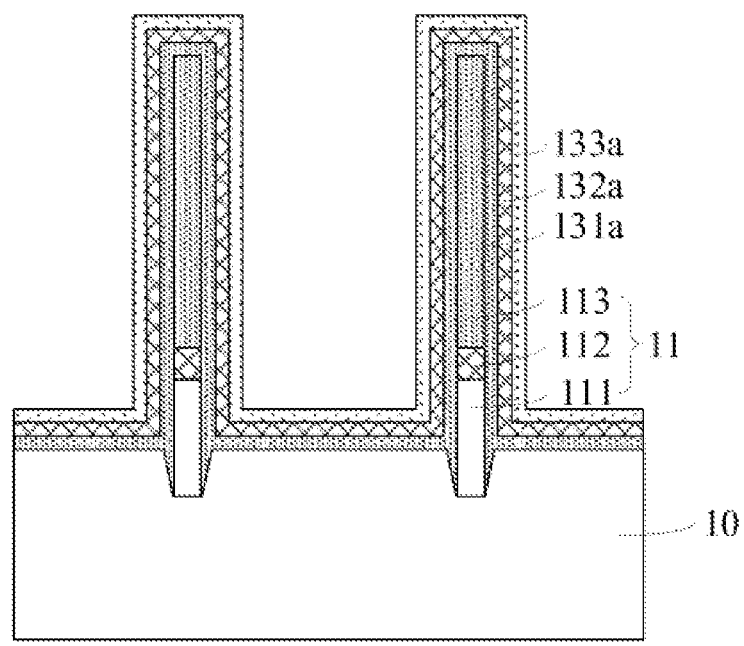
FIG. 5 illustrates a fifth structural schematic diagram corresponding to a step in a manufacturing method for a semiconductor structure according to an embodiment of the present application.

Referring to FIG. 5, a first isolation film 131a, a second isolation film 132a, and a third isolation film 133a, which are sequentially stacked, are formed by a deposition process.

The first isolation film 131a covers a top surface and sidewall of the bit line structure 11 and a surface of the substrate 10. The second isolation film 132a covers a surface of the first isolation film 131a. The third isolation film 133a covers a surface of the second isolation film 132a.

In the present embodiment, the first isolation film 131a is harder than the second isolation film 132a, so as to support the bit line structure 11 well to ensure relatively high structural stability of the semiconductor structure. And the material of the first isolation film 131a may be the same as that of the top dielectric layer 113, so that the first isolation film 131a and the top dielectric layer 113 may subsequently be removed at the same time by the same removal process. The material of the third isolation film 133a is the same as the material of a subsequently used sacrificial layer, so that the sacrificial layer and the third isolation film 133a may be removed at the same time by the same removal process, which is favorable for reducing the process steps and shortening the process period. In addition, the etch selectivity between the second isolation film 132a and the first isolation film 131a and the etch selectivity between the second isolation film 132a and the third isolation film 133a are relatively high under the same etching process.

Specifically, the material of the first isolation film 131a may be silicon nitride. The material of the second isolation film 132a may be silicon oxynitride. The material of the third isolation film 133a may be silicon oxide.

Figure 6:
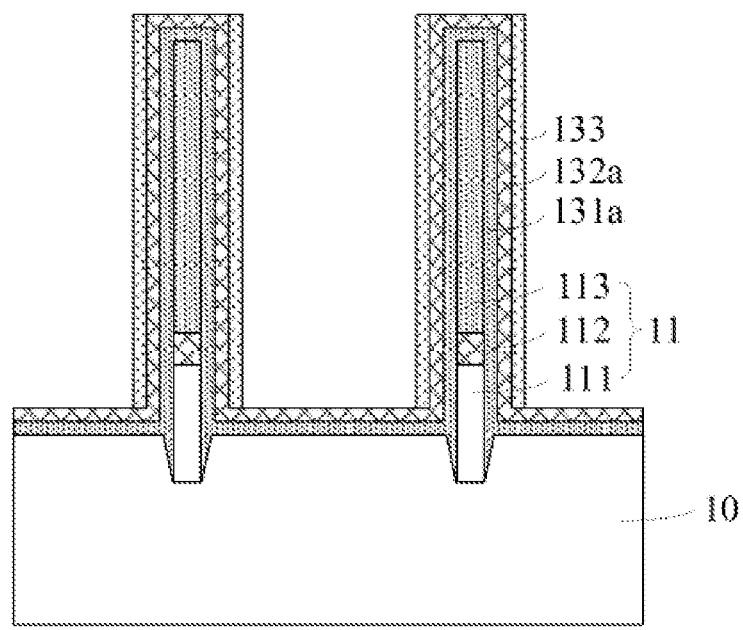
FIG. 6 illustrates a sixth structural schematic diagram corresponding to a step in a manufacturing method for a semiconductor structure according to an embodiment of the present application.

Referring to FIG. 6, a part of the third isolation film 133a (referring to FIG. 5) is removed by a maskless dry etching process. The remaining third isolation film 133a forms the second spacer 133.

Figure 7:
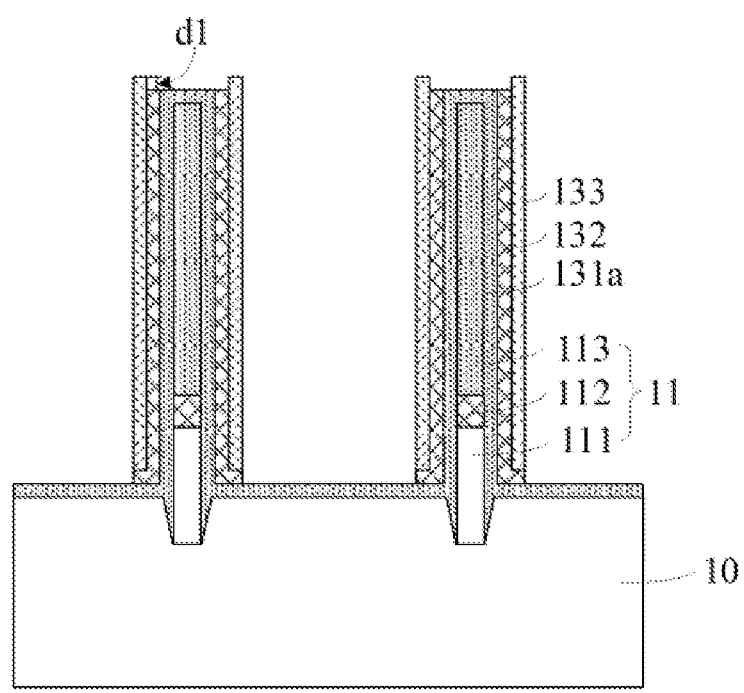
FIG. 7 illustrates a seventh structural schematic diagram corresponding to a step in a manufacturing method for a semiconductor structure according to an embodiment of the present application.

Referring to FIG. 7, the second isolation film 132a (referring to FIG. 6) is etched by using the second spacer 133 as a mask. The remaining second isolation film 132a forms the first spacer 132. The first spacer 132 exposes a top surface of the first isolation film 131a.

In the present embodiment, a top surface of the first spacer 132 is lower than a top surface of the second spacer 133. A first height difference d1 between the top surface of the first spacer 132 and the top surface of the second spacer 133 is used to define the thickness of a subsequently formed first sealing layer. The thickness of the first sealing layer is required not only to ensure that the first sealing layer can be supported effectively without collapse but also to avoid increase of the overall size of the semiconductor structure by an excessively thick first sealing layer.

Specifically, the first height difference d1 ranges from 5 nm to 15 nm, e.g., 8 nm, 10 nm, or 13 nm.

It is to be noted that, since the first height difference d1 may be customized as required, the top surface of the first spacer 132 may be lower than, flush with, or higher than the top surface of the first isolation film 131a.

Figure 8:
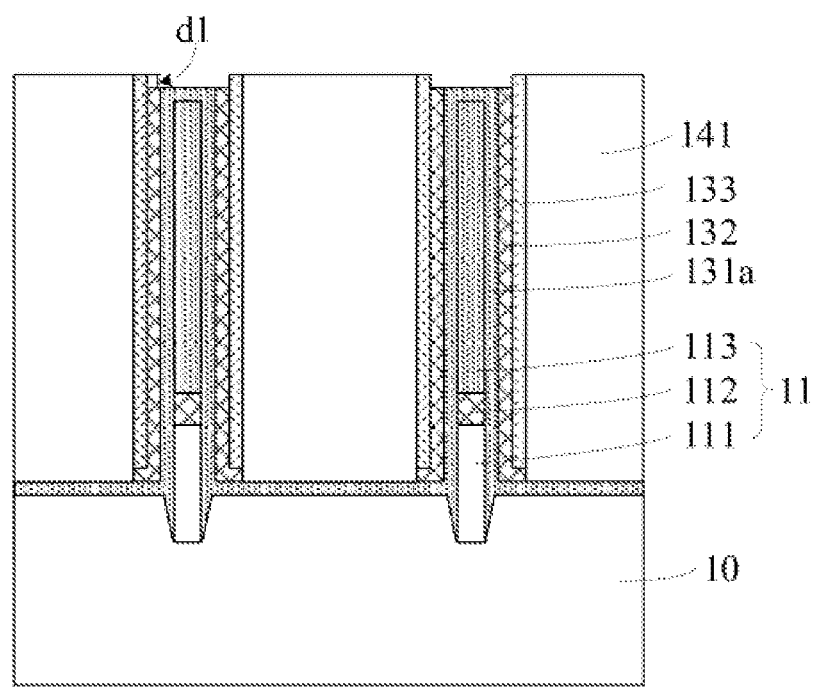
FIG. 8 illustrates an eighth structural schematic diagram corresponding to a step in a manufacturing method for a semiconductor structure according to an embodiment of the present application.

Referring to FIG. 8, a first sacrificial layer 141 that fills a portion between adjacent bit line structures 11 is formed.

The first sacrificial layer 141 is formed to avoid the first isolation film 131a covering the surface of the substrate 10 being etched when the first isolation film 131a and the top dielectric layer 113 are subsequently etched away to form a first void, thereby protecting the substrate 10.

In the present embodiment, the material of the first sacrificial layer 141 is different from the material of the second spacer 133. Specifically, the first sacrificial layer 141 and the second spacer 133 are removed at greatly different rates in the same polishing process. In such case, the progress of the polishing process can be controlled by obtaining the removal rate of the polishing process. Therefore, a subsequent planarization process may be stopped accurately at a plane where the top surface of the second spacer 133 is located to further improve the automation degree of the planarization process, and an operator does not need to detect the progress of the process. Further, stopping the planarization process accurately at the plane where the top surface of the second spacer 133 is located is favorable for ensuring that the thickness of the first sealing layer may be defined by the first height difference d1, thereby improving the accuracy of the thickness of the first sealing layer.

In the present embodiment, the removal rate of the first sacrificial layer 141 is higher than that of the second spacer 133 in the same polishing process. Specifically, the material of the first sacrificial layer 141 includes a photoresist. In other embodiments, the material of the first sacrificial layer is the same as that of the second spacer or the removal rate of the first sacrificial layer is lower than that of the second spacer. Specifically, the material of the first sacrificial layer includes silica.

Figure 9:
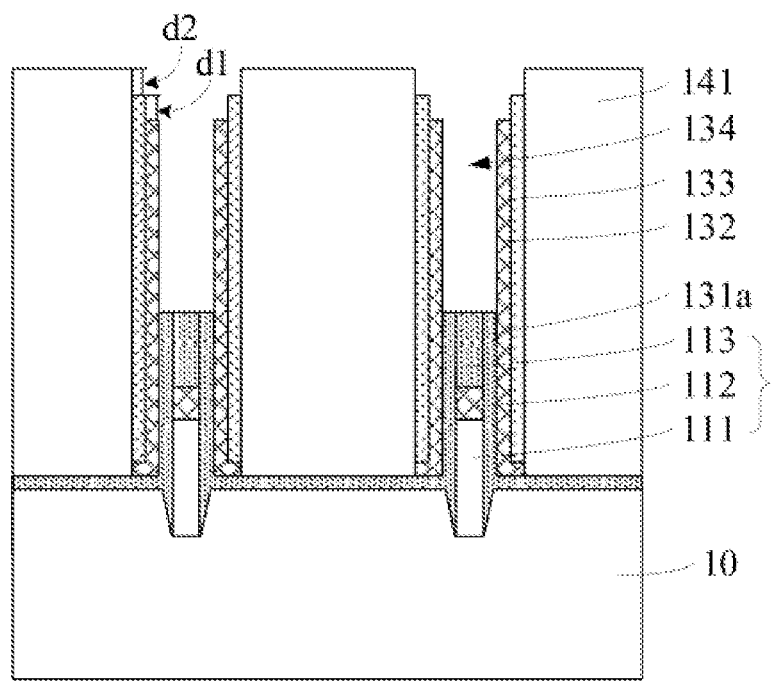
FIG. 9 illustrates a ninth structural schematic diagram corresponding to a step in a manufacturing method for a semiconductor structure according to an embodiment of the present application.

Referring to FIG. 9, the first isolation film 131a and the top dielectric layer 113 between opposite second spacers 133 are removed to form a first void 134.

Since the etch selectivity is not infinite, the first sacrificial layer 141, the second spacer 133, and the first spacer 132 may also be correspondingly etched during etching of the first isolation film 131a and the top dielectric layer 113. When the first sacrificial layer 141 and the second spacer 133 are etched by different thicknesses, a second height difference d2 in a direction perpendicular to the substrate 10 may be formed. Meanwhile, since an etchant is for the first isolation film 131a and the top dielectric layer 113, the first sacrificial layer 141 and the second spacer 133 are etched by relatively small thicknesses, and the formed second height difference d2 is correspondingly small. The second height difference d2 is generally negligible relative to the first height difference d1.

Correspondingly, due to different etch selectivity, the first spacer 132 and the second spacer 133 may be etched by different thicknesses, which may further result in a change in the numerical value of the first height difference d1, i.e., formation of a first height difference fluctuation Δd1. Since the etchant is for the first isolation film 131a and the top dielectric layer 113, the first height difference fluctuation Δd1 formed by etching the first spacer 132 and the second spacer 133 is negligible relative to the first height difference d1.

Figure 10:
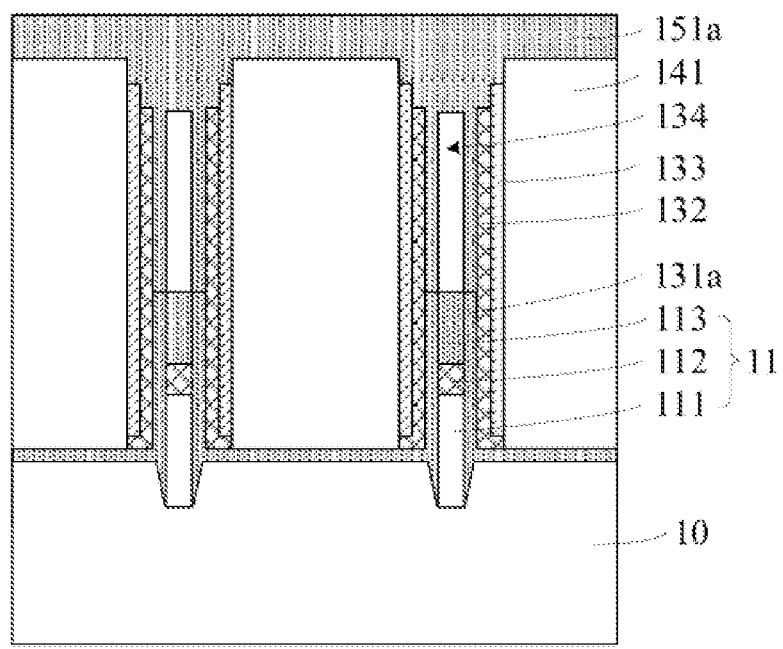
FIG. 10 illustrates a tenth structural schematic diagram corresponding to a step in a manufacturing method for a semiconductor structure according to an embodiment of the present application.

Referring to FIG. 10, a first sealing film 151a is formed by a deposition process.

In the present embodiment, the first sealing film 151a covers a sidewall of the first spacer 132 and a top surface of the first spacer 132 to plug a top opening of the first void 134. In other embodiments, the first sealing film also covers a top surface of the top dielectric layer.

It is to be noted that the formation of the first sealing film 151a may compress a space of the first void 134. In the embodiment of the present application, the first void 134 refers to the remaining void space after compression.

It is also to be noted that a formed sealing layer is usually thin if there is no additional support. Specifically, the first sealing film 151a located between opposite first spacers 132 and on the first void 134 is relatively thin.

Figure 11:
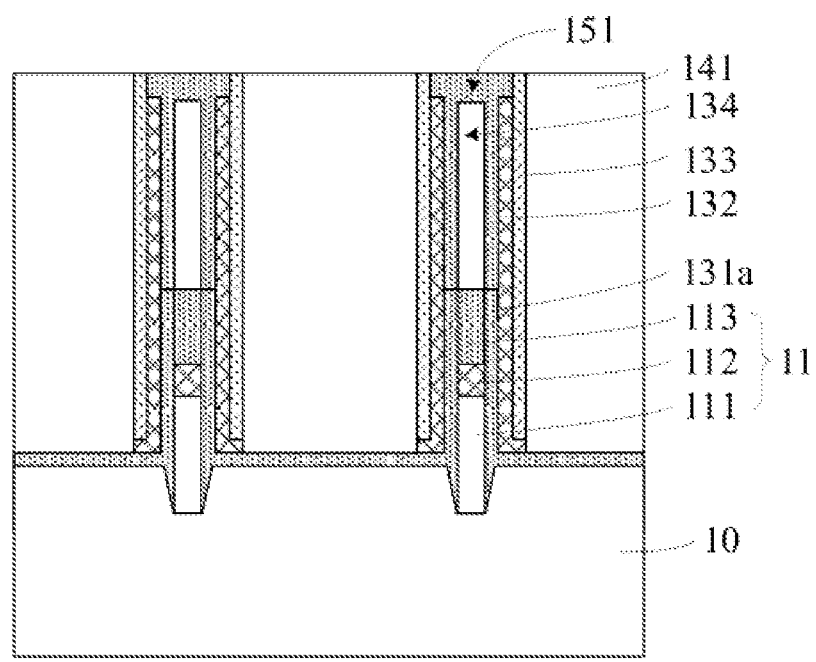
FIG. 11 illustrates an eleventh structural schematic diagram corresponding to a step in a manufacturing method for a semiconductor structure according to an embodiment of the present application.

Referring to FIG. 11, a part of the first sealing film 151a (referring to FIG. 10) and a part of the first sacrificial layer 141 are removed by a planarization process. The remaining first sealing film 151a forms the first sealing layer 151. A top surface of the first sealing layer 151 is flush with the top surface of the second spacer 133.

In the present embodiment, based on the position limit of the second spacer 133 and the support of the first spacer 132, the first sealing layer 151 having a preset thickness may be formed without any mask. Therefore, high support performance of the first sealing layer 151 and high structural stability of the semiconductor structure are ensured.

Figure 12:
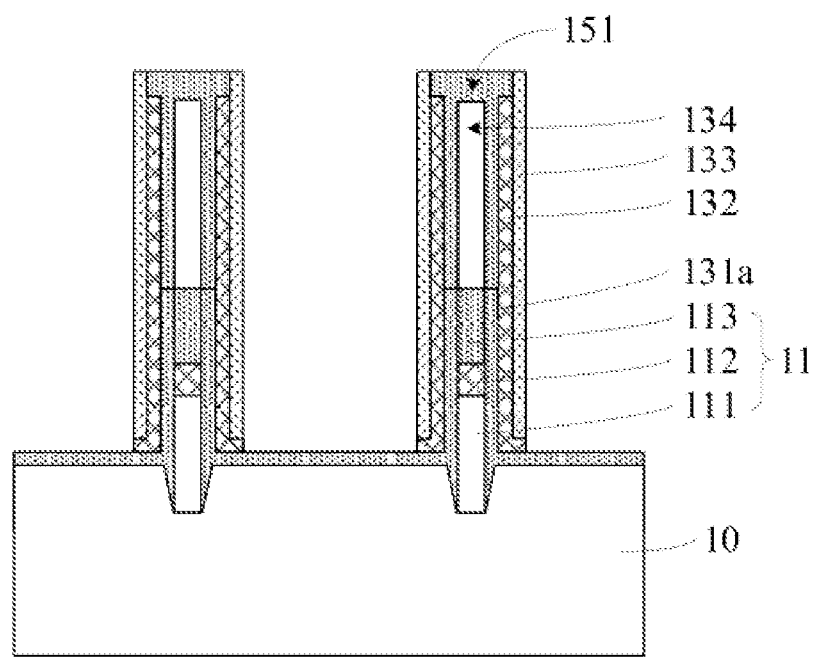
FIG. 12 illustrates a twelfth structural schematic diagram corresponding to a step in a manufacturing method for a semiconductor structure according to an embodiment of the present application.
Figure 13:
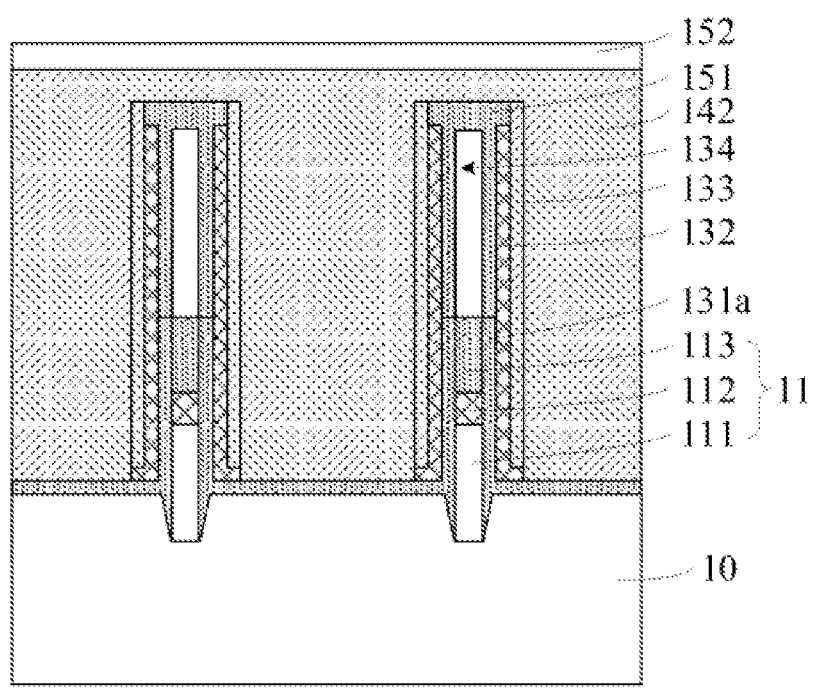
FIG. 13 illustrates a thirteenth structural schematic diagram corresponding to a step in a manufacturing method for a semiconductor structure according to an embodiment of the present application.

Referring to FIGS. 12 and 13, the first sacrificial layer 141 (referring to FIG. 11) is removed. A second sacrificial layer 142 is formed to replace the first sacrificial layer 141. A fifth mask layer 152 is formed on a top surface of the second sacrificial layer 142.

In the present embodiment, the top surface of the second sacrificial layer 142 is higher than the top surfaces of the spacer and the first sealing layer 151. In other embodiments, the top surface of the second sacrificial layer is flush with or lower than the top surface of the spacer.

In the present embodiment, the material of the second sacrificial layer 142 is the same as the material of the second spacer 133. As such, the second sacrificial layer 142 and the second spacer 133 may subsequently be removed rapidly by the same etchant.

Figure 14:
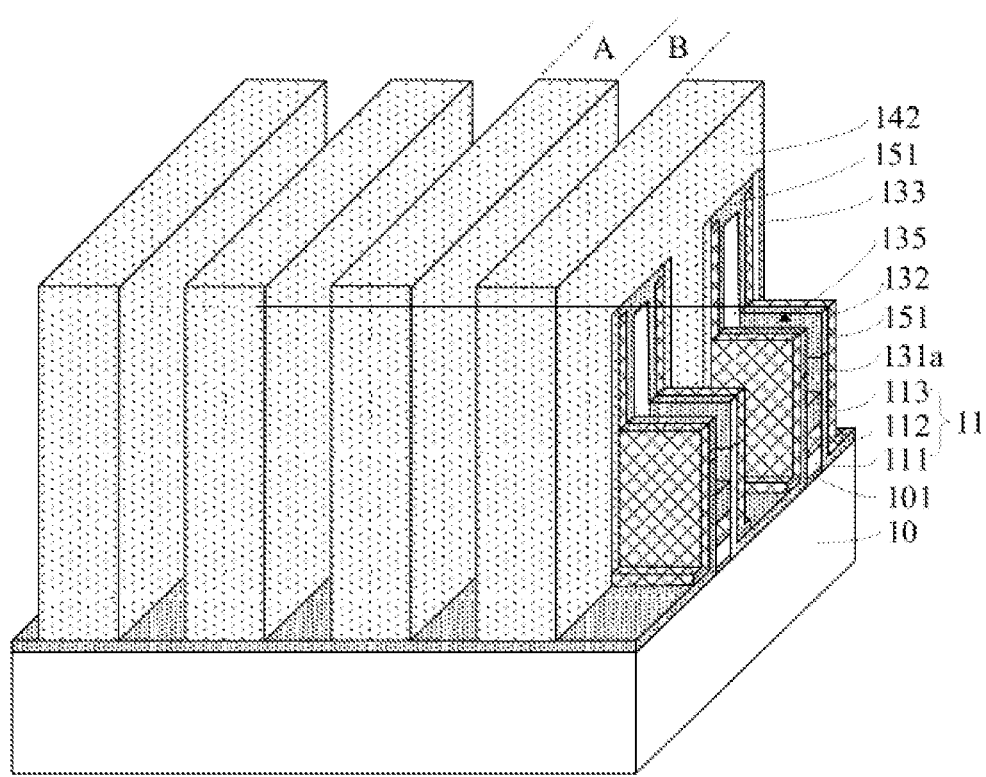
FIG. 14 illustrates a fourteenth structural schematic diagram corresponding to a step in a manufacturing method for a semiconductor structure according to an embodiment of the present application.

Referring to FIG. 14, a dry etching process is performed through the fifth mask layer 152.

In the present embodiment, the substrate 10 may be divided into a first region A and a second region B that are spaced in a direction parallel to an extending direction of the bit line structure 11. The first region A between adjacent bit line structures 11 is configured to form a capacitive contact hole and fill a capacitive contact window. The second region B between adjacent bit line structures 11 is configured to form an isolation layer. The isolation layer is configured to divide capacitive contact holes and isolate adjacent capacitive contact windows.

In the present embodiment, the fifth mask layer 152 (referring to FIG. 13) covers the top surface of the second sacrificial layer 142 in the first region A and exposes the top surface of the second sacrificial layer 142 in the second region B. Correspondingly, performing the dry etching process through the fifth mask layer 152 includes removing the second sacrificial layer 142 in the second region B and the second spacer 133 in the second region B.

In the present embodiment, an etchant for the dry etching process is for the material of the second sacrificial layer 142. Since the etching rate of the second sacrificial layer 142 is relatively high when the dry etching process is performed, the first spacer 132 is gradually exposed when the etchant etches the first sealing layer 151. Further, since the angle in the dry etching process is not always perpendicular to the surface of the substrate 10 (because of either the setting of the etching process or the process stability), the etchant may etch the exposed first spacer 132 and a further exposed sidewall of the first sealing layer 151, so that not only the second sacrificial layer 142 and the second spacer 133, but also a part of the first spacer 132 and a part of the first sealing layer 151 can be removed in the dry etching process. In such case, the first void 134 in the second region B (referring to FIG. 13) is turned into a second void 135. A top surface of the second void 135 is lower than a top surface of the first void 134.

In the direction perpendicular to the surface of the substrate 10, the thickness of the removed first spacer 132 is related to the etch selectivity of the second spacer 133 and the first spacer 132, and the thickness of the removed first sealing layer 151 is related to the etch selectivity of the second spacer 133 and the first sealing layer 151. Specifically, in the dry etching process, if the etch selectivity of the second spacer 133 and the first spacer 132 is higher, the removed first spacer 132 is thinner, and the remaining first spacer 132 is thicker. Correspondingly, if the etch selectivity of the second spacer 133 and the first sealing layer 151 is higher, the removed first sealing layer 151 is thinner, and the remaining first sealing layer 151 is thicker.

Figure 15:
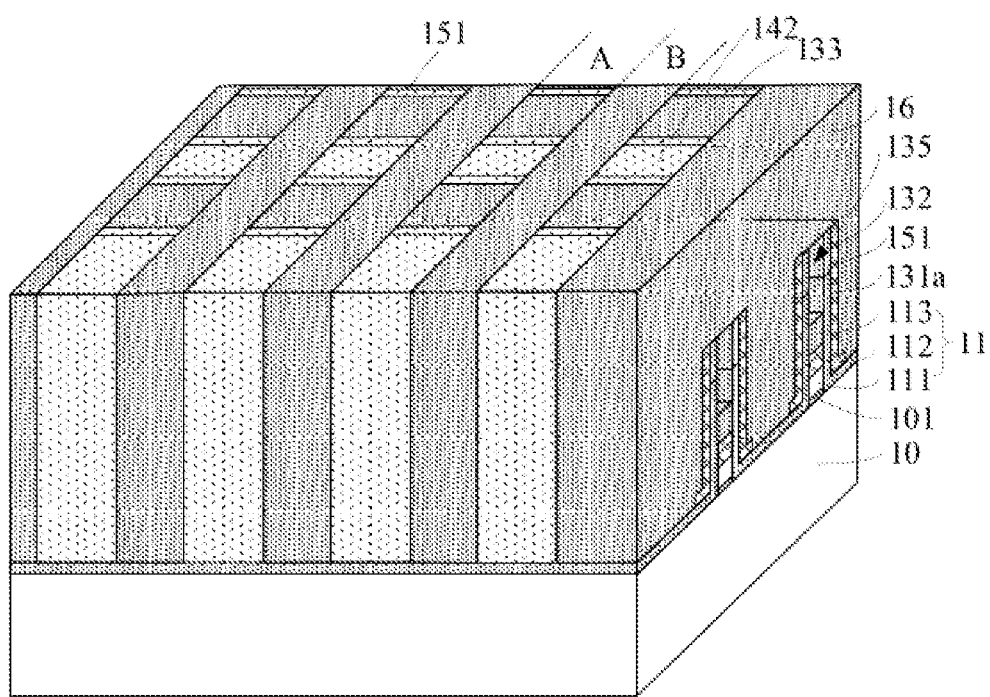
FIG. 15 illustrates a fifteenth structural schematic diagram corresponding to a step in a manufacturing method for a semiconductor structure according to an embodiment of the present application.

Referring to FIG. 15, a deposition process and a planarization process are performed.

In the present embodiment, the fifth mask layer 152 is removed before the deposition process, to avoid contact between a polishing device and at least three materials (the material of the fifth mask layer 152, the material of the second sacrificial layer 142, and the material deposited by the deposition process) during the subsequent planarization process and further avoid a concave-convex structure formed by great different removal rates of different materials affecting the polishing device. Therefore, relatively long service life of the polishing device is ensured or it is unnecessary to replace a polishing solution or mask component midway to avoid an excessive difference between the removal rates, and thus the process efficiency is improved.

In other embodiments, the fifth mask layer is retained when the deposition process is performed, and the fifth mask layer and the other film layers are subsequently removed by the planarization process, which reduce the process steps and shorten the process period.

In the present embodiment, the deposition process is used to form a packing layer 16. The packing layer 16 includes a second sealing layer (not shown) configured to plug the second void 135 and an isolation layer (not shown) configured to isolate adjacent capacitive contact windows. That is, the first sealing layer and the isolation layer are simultaneously formed in the same deposition process.

Specifically, an isolation film and second sealing film of which top surfaces are higher than the top surface of the first sealing layer 151 are formed at first. Then, the planarization process is performed on the isolation film and the second sealing film, to form the isolation layer and second sealing layer of which the top surfaces flush with the top surface of the first sealing layer 151.

In the present embodiment, the second sacrificial layer 142 on the first sealing layer 151 in the first region A is also removed by the planarization process to expose the first sealing layer 151.

Figure 16:
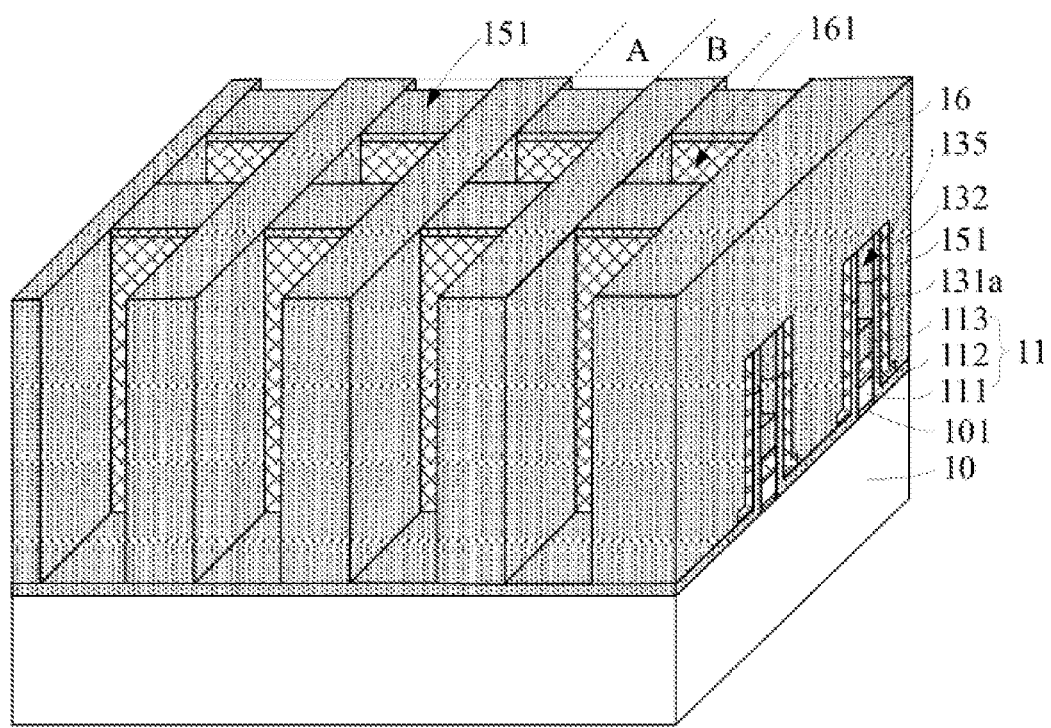
FIG. 16 illustrates a sixteenth structural schematic diagram corresponding to a step in a manufacturing method for a semiconductor structure according to an embodiment of the present application.

Referring to FIG. 16, the remaining second sacrificial layer 142 and second spacer 133 (referring to FIG. 14) in the first region A are etched to form an initial capacitive contact hole 161.

In order to form the capacitive contact hole to make the capacitive contact window filling the capacitive contact hole contact with the active area in the substrate 10, it is also necessary to remove the first isolation film 131*a* between the initial capacitive contact hole 161 and the substrate 10, to form the capacitive contact hole that exposes the surface of the substrate 10.

In the present embodiment, after the second sacrificial layer 142 is removed, the first isolation film 131*a* between the initial capacitive contact hole 161 and the substrate 10 is further removed to form the capacitive contact hole.

Figure 17:
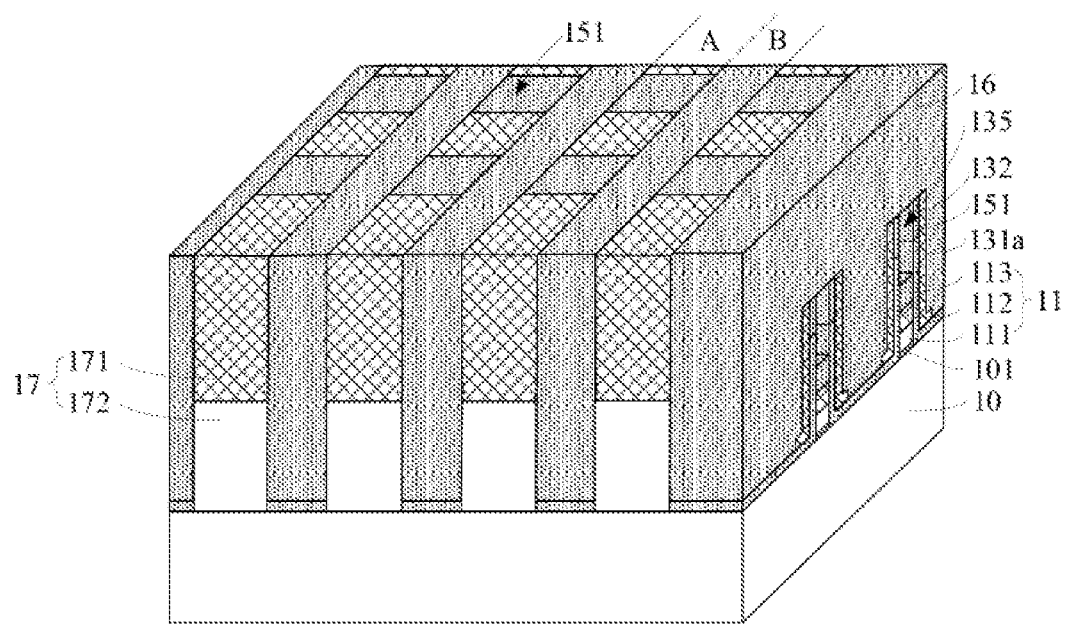
FIG. 17 illustrates a seventeenth structural schematic diagram corresponding to a step in a manufacturing method for a semiconductor structure according to an embodiment of the present application.

Referring to FIG. 17, a second void 135 is formed.

In the present embodiment, the capacitive contact window 17 includes a first capacitive contact window 171 at the top and a second capacitive contact window 172 at the bottom. Contact resistance between the second capacitive contact window 172 and the substrate 10 is lower than contact resistance between the first capacitive contact window 171 and the substrate 10, which improves the signal transmission performance.

The material of the first capacitive contact window 171 includes tungsten. The material of the second capacitive contact window 172 includes polycrystalline silicon.

In the present embodiment, the thickness of the first sealing layer may be defined by multiple layers of spacers which are different in height without any additional mask. That is, the spacer whose top surface is lower provides a support and the spacer whose top surface is higher limits the position, to form a relatively thick first sealing layer to ensure relatively high support performance of the first sealing layer and relatively high structural stability of the semiconductor structure.

Correspondingly, an embodiment of the present application also provides a semiconductor structure, which may be manufactured by the abovementioned manufacturing method for a semiconductor structure.

Referring to FIG. 17, the semiconductor structure includes: a substrate 10, bit line structures 11 disposed on the substrate 10, and capacitive contact holes (not shown) arranged on opposite sides of the bit line structure 11; a first spacer 132 which is disposed between the bit line structure 11 and a the capacitive contact hole, and there being a void arranged between the first spacers 132 on the opposite sides of the bit line structure 11; and a sealing layer, which covers a top surface of the first spacer 132 and plugs a top opening of the void, a thickness of the sealing layer on the first spacer 132 being more than or equal to 30 nm in a direction perpendicular to the substrate 10.

In the present embodiment, the void includes a first void (not shown in the figure) arranged between two opposite capacitive contact holes and a second void 135 disposed between adjacent first voids in an extending direction of the bit line structure 11. A top surface of the first void is higher than a top surface of the second void 135.

In the present embodiment, the semiconductor structure further includes isolation layers, the isolation layer disposed on the opposite sides of the bit line structure 11 and configured to isolate adjacent capacitive contact holes. The second void 135 is arranged between two opposite isolation layers.

In the present embodiment, the sealing layer includes a first sealing layer 151 configured to plug the first void and a second sealing layer configured to plug the second void 135. The thickness of the first sealing layer 151 in a direction perpendicular to a surface of the substrate 10 is more than or equal to 30 nm, e.g., 32 nm, 34 nm, or 36 nm.

In the present embodiment, the thickness of the void in the direction perpendicular to the surface of the substrate 10 is less than or equal to 80 nm, e.g., 72 nm, 75 nm, or 78 nm. This avoids a structural collapse caused by the incapability of the void in supporting and ensures relatively high structural stability of the semiconductor structure.

In the present embodiment, the thickness of the sealing layer is greater than a preset value, which is favorable for ensuring high support performance of the sealing layer and avoiding collapse caused by the fact that the sealing layer does not meet a pressure-bearing requirement, thereby ensuring high structural stability of the semiconductor structure.

Compared with a conventional art, the technical solutions provided in the embodiments of the present application have the following advantages:

In the technical solutions above, the thickness of the first sealing layer may be defined by multiple layers of spacers which are different in height without any additional mask. That is, the spacer whose top surface is lower provides a support and the spacer whose top surface is higher limits the position, to form a relatively thick first sealing layer to ensure relatively high support performance of the first sealing layer and relatively high structural stability of the semiconductor structure.

In addition, the second sealing layer is thicker than the first sealing layer, and the second sealing layer can bear more compressive stress, thereby further relieving pressure born by the first sealing layer, avoiding the collapse of the first sealing layer, and correspondingly avoiding damage to the semiconductor structure and increase of parasitic capacitance to ensure relatively high structural stability of the semiconductor structure and relatively low parasitic capacitance between adjacent capacitive contact windows.

Those of ordinary skilled in the art can understand that the above-mentioned embodiments are specific embodiments for implementing the present application, and in practical application, various changes can be made to the embodiments in terms of forms and details without departing from the spirit and scope of the present application. Those skilled in the art may make respective variations and modifications without departing from the spirit and scope of the present application, and thus the protection scope of the present application should be subject to the scope defined by the claims.

In the embodiments of the present application, a substrate and a bit line structure located thereon are provided. The bit line structure includes a top dielectric layer and has capacitive contact holes on both sides. A first spacer that covers a sidewall of the top dielectric layer is formed, and a second spacer that covers a sidewall of the first spacer is formed. The first spacer is located between the bit line structure and the capacitive contact hole. A top surface of the second spacer is higher than a top surface of the first spacer. At least part of the top dielectric layer is removed to form a first void. A deposition process is performed to form a first sealing film that covers the top surface of the first spacer and plugs a top opening of the void. A top surface of the first sealing film is higher than the top surface of the second spacer. A part of the first sealing film which is higher than the top surface of the second spacer is removed by a first planarization process, the remaining first sealing film forms a first sealing layer. In such a manner, it is favorable for improving the structural stability of the semiconductor structure.

What is claimed is:

1. A semiconductor structure, comprising:
a substrate, bit line structures disposed on the substrate, and capacitive contact holes arranged on opposite sides of each of the bit line structures;
first spacers, each of the first spacers disposed between each of the bit line structures and each of the capacitive contact holes;
voids, each of the voids arranged between the first spacers on the opposite sides of each of the bit line structures; and
sealing layers, each of the sealing layers covering a top surface of each of the first spacers and plugging a top opening of each of the voids, a thickness of each of the sealing layers on each of the first spacers being more than or equal to 30 nm in a direction perpendicular to the substrate; wherein each of the voids comprises a first void arranged between two opposite capacitive contact holes and a second void disposed between two first voids of the adjacent voids in an extending direction of the bit line structures;
the semiconductor structure further comprising isolation layers, each of the isolation layers disposed on the opposite sides of each of the bit line structures and configured to isolate adjacent capacitive contact holes, wherein the second void is arranged between two opposite isolation layers.

2. The semiconductor structure of claim 1, wherein each of the sealing layers comprises a first sealing layer configured to plug the first void and a second sealing layer configured to plug the second void.

3. The semiconductor structure of claim 1, wherein a top surface of the first void is higher than a top surface of the second void in a direction perpendicular to a surface of the substrate.

4. The semiconductor structure of claim 1, wherein a thickness of each of the voids is less than or equal to 80 nm in a direction perpendicular to a surface of the substrate.

* * * * *